(12) United States Patent
Jiang

(10) Patent No.: US 6,760,737 B2
(45) Date of Patent: Jul. 6, 2004

(54) SPATIAL MEDIAN FILTER

(75) Inventor: Hong Jiang, Warren, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 479 days.

(21) Appl. No.: 09/760,923

(22) Filed: Jan. 16, 2001

(65) Prior Publication Data

US 2001/0034749 A1 Oct. 25, 2001

Related U.S. Application Data

(60) Provisional application No. 60/192,294, filed on Mar. 27, 2000.

(51) Int. Cl.[7] .................................................. G06F 7/08
(52) U.S. Cl. ...................................................... 708/202
(58) Field of Search ........................................ 708/202

(56) References Cited

U.S. PATENT DOCUMENTS

| | | | | | |
|---|---|---|---|---|---|
| 4,682,230 A | * | 7/1987 | Perlman et al. | ............. | 348/616 |
| 5,384,865 A | * | 1/1995 | Loveridge | ................... | 382/262 |
| 5,737,251 A | * | 4/1998 | Kohno et al. | ............... | 708/207 |
| 5,900,006 A | * | 5/1999 | Yoon | .......................... | 708/202 |
| 5,968,111 A | * | 10/1999 | Bae et al. | .................. | 708/202 |
| 6,199,084 B1 | * | 3/2001 | Wiseman | ................... | 708/304 |

* cited by examiner

*Primary Examiner*—David H. Malzahn

(57) ABSTRACT

A spatial median filter determines a median of a plurality of values by dividing the plurality of values into a plurality of groups of values. The values in each of the groups are sorted to determine its median. Then, the medians of the plurality of groups are fully sorted. Certain of the sorted values are eliminated from prescribed ones of the groups in accordance with prescribed criteria based on the number of values in the group and the median value of the group values. The remaining values are sorted to determine the median of the plurality of values.

13 Claims, 1 Drawing Sheet

SPATIAL MEDIAN FILTER

RELATED APPLICATIONS

This application claims the priority of the corresponding provisional application, Serial No. 60/192,294, filed Mar. 27, 2000. U.S. patent application Ser No. 09/760,924 was filed concurrently herewith.

TECHNICAL FIELD

This invention relates to filters and, more particularly, to determining the median of a plurality of values.

BACKGROUND OF THE INVENTION

A standard prior known approach in finding a median of N values is to fully sort the sequence of N values by arranging the N values in the sequence in either ascending or descending order, e.g., 4, 10, 20, . . . or . . . , 20, 10, 4, respectively, and then picking the middle value of the sorted sequence of N values. The optimal number of comparisons needed to sort N values is in the order of $K*N*\log(N)$, where K is some constant independent of N. This process of finding a median is not optimal, because the sorting is more than what is needed to locate the median. Sorting arranges all values in an ascending or a descending order. It produces the location of every value in the sequence, not only the median. In locating a median, only the median itself is of interest, it is not necessary to know the order of other values in the sequence. Therefore, using a full sorting process to locate the median is not optimal, and it requires making significantly more comparisons than are actually necessary.

SUMMARY OF THE INVENTION

The problems and limitations of prior spatial median filters is overcome in determining a median of a plurality of values, in accordance with the invention, by dividing the plurality of values into a plurality of groups of values. The values in each of the groups are sorted to determine its median. Then, the medians of the plurality of groups are fully sorted. Certain sorted values are eliminated from prescribed ones of the groups in accordance with prescribed criteria based on the number of values in the group and the median value of the group values. The remaining values are sorted to determine the median of the plurality of values.

A technical advantage of the invention is that fewer comparisons are required to determine the median of a plurality of values than in prior known arrangements. Consequently, this results in a significantly simpler implementation of a spatial median filter including an embodiment of the invention.

Another technical advantage of the invention is that in the process of determining the median values that are less than or equal and values that are greater than or equal to the median are also identified without any additional processing.

DETAILED DESCRIPTION OF THE INVENTION

A. Theoretical Discussion

Figure 1:
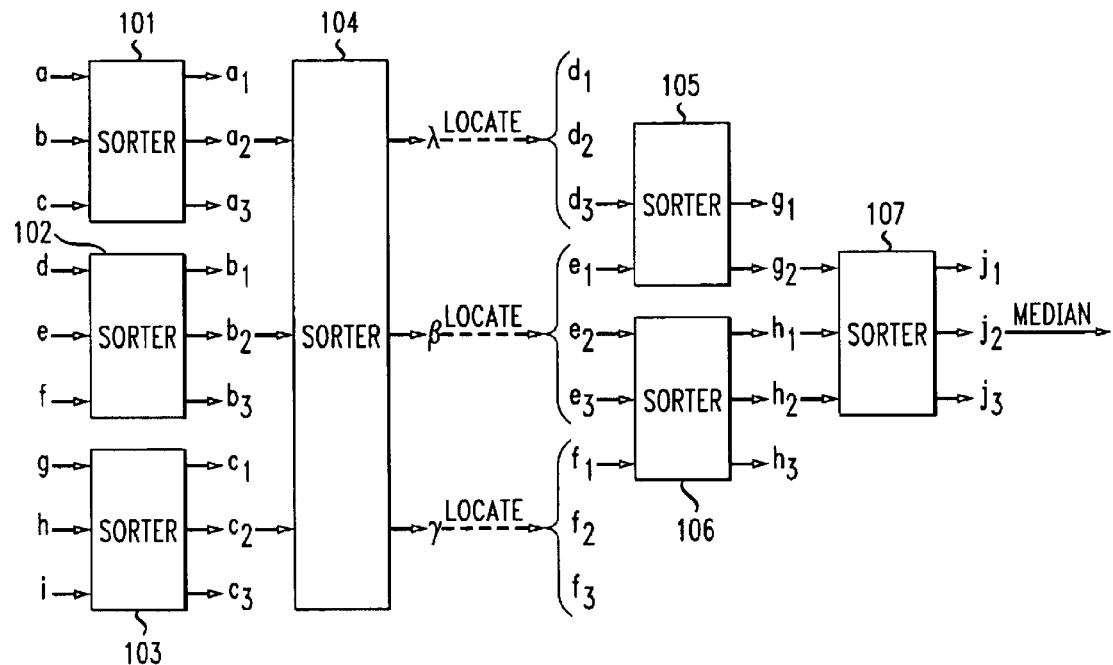
FIG. 1 shows, in simplified form details of a nine-value, i.e., point, spatial median filter including an embodiment of the invention.

By employing an embodiment of the current invention, finding the median of N values is more efficient than the prior known process of full sorting. Finding the median of N values is divided into a group of problems of finding the median of M values, where M is significantly smaller than N. The total number of comparisons required to solve the group of problems is smaller than that required to sort the original N values.

More specifically, to find the median of N values, we divide the N values, in this example, into three groups, namely, $G_1$, $G_2$ and $G_3$. Assume group $G_1$ has $N_1$ values, group $G_2$ has $N_2$ values and group $G_3$ has $N_3$ values. Therefore, the three groups contain all N values, namely, $N=N_1+N_2+N_3$. Now assume that a median has been determined for each of the groups $G_1$, $G_2$ and $G_3$, and have been labeled as $A_1$, $A_2$ and $A_3$, respectively. $A_1$ is the median of group $G_1$, $A_2$ is the median of group $G_2$ and A3 is the median of group $G_3$.

Furthermore, it is assumed that all values have been determined in group $G_1$ that are less than or equal to median $A_1$. These values are designated as being in sub-group $G_{11}$. Similarly, all values that are greater than or equal to median $A_1$ in group $G_1$ are designated as being in sub-group $G_{12}$. All values in group $G_2$ that are less than or equal to median $A_2$ are designated as being in sub-group $G_{21}$. Similarly, all values in group $G_2$ that are greater than or equal to median $A_2$ are designated as being in sub-group $G_{22}$. All values in group $G_3$ that are less than or equal to median $A_3$ are designated as being in sub-group $G_{31}$. Similarly, all values in group $G_3$ that are greater than or equal to median $A_3$ are designated as being in sub-group $G_{32}$.

How the median $A_1$ and the first set of sub-groups including $G_{11}$ and $G_{12}$ of group $G_1$ are determined is not being specified at this moment. It is sufficient to say that they may be found by using the current process: further dividing group $G_1$ into a second set of three sub-groups, and applying the current process recursively. When eventually, a sub-group in the second set contains 9 or fewer values, the median of the particular sub-group can be found by using the median determining process of the 9-value, i.e., point, spatial median filter to be described in more detail below in relationship to the 9-value spatial median filter implementation. This process also applies to the remaining groups which, in this example, are groups $G_2$ and $G_3$. Medians $A_2$ and $A_3$ and the corresponding sub-groups $G_{21}$, and $G_{22}$, and $G_{31}$ and $G_{32}$ of groups $G_2$ and $G_3$, respectively, are found in the same manner as median $A_1$ and sub-groups $G_{11}$ and $G_{12}$ of group $G_1$.

It is noted that the current process, in addition to determining the median of each group of values, also yields a sub-group including all values that are less than or equal to the median of the group and a sub-group including all values that are greater than or equal to the median of the group. This is realized without any additional processing.

For now, it is assumed that the three medians and six sub-groups have been determined, namely, median $A_1$, and sub-groups including $G_{11}$ and $G_{12}$ of group $G_1$, median $A_2$, and sub-groups $G_{21}$ and $G_{22}$ of group $G_2$, and median $A_3$, and sub-groups $G_{31}$ and $G_{32}$ of group $G_3$. Then, the three medians $A_1$, $A_2$ and $A_3$ are fully sorted. Without loss of generality, we can assume $A_1 \leq A_2 \leq A_3$. If they are not, the smallest value of $A_1$, $A_2$ and $A_3$ is re-labeled to be $A_1$, and it's associated group as $G_1$, and the associated sub-groups as $G_{11}$ and $G_{12}$ etc.

At this stage, some values can be eliminated from the N values. That is, the median of the N values is guaranteed to be among the surviving values. Specifically, median $A_1$ and all values in sub-group $G_{11}$ can be eliminated. Additionally, median $A_3$ and all values in sub-group $G_{32}$ can also be eliminated. Let $M_1$=floor($N_1/2$), i.e., the largest integer that is less than or equal to $N_1/2$. Note $M_1=(N_1-1)/2$, if $N_1$ is odd. $M_1$ includes all the values in sub-group $G_{11}$ because they are less than or equal to $A_1$. Similarly, let $M_3=\text{floor}(N_3/2)$, i.e., the smallest integer that is greater than or equal to $N_3/2$. $M_3$ includes all values in sub-group $G_{32}$ because they are greater than or equal to $A_3$. The total number of values eliminated is therefore equal to $M_1+M_3+2$. After the elimination of these values, the surviving values from the original N values are:

a) all values in sub-group $G_{12}$ from group $G_1$ that are greater than or equal to $A_1$, excluding $A_1$, there are $M_1-1$ of them;

b) all values in group $G_2$ ($N_2$ of them); and c) all values in sub-group $G_{31}$ from group $G_3$ that are less than or equal to $A_3$, excluding $A_3$, there are $M_3-1$ of them.

Therefore, the total number of surviving values is $P=N-\text{floor}(N_1/2)-\text{floor}(N_3/2)-2$. Now the remaining task is to find the median of the remaining $P=(N-\text{floor}(N_1/2)-\text{floor}(N_3/2)-2)$ values. Thus, the original problem of finding the median of N values is reduced to the following:

1) find three medians of the three groups of size $N_1$, $N_2$, and $N_3$, and obtain sub-groups $G_{11}$, $G_{12}$, $G_{21}$, $G_{22}$, $G_{31}$ and $G_{32}$;

2) find the median of the three medians in 1) above;

3) find the median of the remaining $P=(N-\text{floor}(N_1/2)-\text{floor}(N_3/2)-2)$ values, and find the two sub-groups, a first sub-group including all values that are less than or equal to the median of the P values and a second sub-group including all values that are greater than or equal to the median of the P values.

This process can be applied recursively to finding the medians in the steps 1) and 3) above. For example, the problem of finding the median $A_1$ of group $G_1$ can be further divided into the above three steps. The recursion stops when the size of median filter is small, for example, 9. At that point, the process of finding the median in a 9-value spatial median filter can be used. If one starts with N<9, the above process still can be applied. The size is recursively reduced. The recursion stops when the size becomes three (3). Then, the median of 3-points can be found by sorting the three values. The optimal 3-value spatial median filter is the same as the full sort of the 3 values.

B. Preferred Embodiments

FIG. 1 shows, in simplified form, details of a so-called 9-value spatial median filter that is advantageously used in practicing the invention. The spatial median filter can be advantageously employed to measure the overall effect of all values that make up an object. Additionally, since each individual value may be prone to random noise, use of spatial median filter can also reduce the effects of the noise.

Referring to FIG. 1, it is seen that the 9-points, i.e., values, are arranged into three groups of three values each, namely, a first group including values a, b and c, a second group including values d, e and f, and a third group including values g, h and j. The first group is supplied to sorter 101, the second group to sorter 102 and the third group to sorter 103. Sorters 101, 102 and 103 each perform a complete sort of their respective supplied groups, i.e., arrange the supplied values in either ascending or descending order. In the spatial median filter shown in FIG. 1, it is assumed that the values are arranged in ascending order. That is, $A_3 \geq A_2 \geq A_1$ and so on for the other values. Note that a sorter of three values requires three comparisons. Thus, the three sorters 101, 102 and 103 perform nine comparisons. The median of each group is determined to be the middle value in the sorted group. The three medians from sorters 101, 102 and 103, in this example, are $a_2$, $b_2$ and $c_2$, respectively, and are supplied to sorter 104. In turn, sorter 104 sorts the three medians $a_2$, $b_2$ and $c_2$. This requires another three comparisons. After sorting, the three medians $a_2$, $b_2$ and $c_2$, are assumed to be arranged in ascending order and are designated $\lambda$, $\beta$ and $\gamma$, respectively, where $\lambda \leq \beta \leq \gamma$. Now the nine values of the spatial median filter are reduced to five values by removing four values. The remaining five values include the median of the nine values. This reduction is realized by first identifying the group of three values who's median is $\lambda$. These values are labeled in ascending order as $d_1 \leq d_2 \leq d_3$. It is noted that these three values had been sorted in the prior sorting operations. Additionally, since $d_2$ is the median of the group, it has the same value as $\lambda$. It can be shown that both $d_1$ and $d_2$ are each less than or equal to the median of the nine values and, hence, can be removed from the nine values. Now label the three values having $\gamma$ as its median in ascending order as $f_1 \leq f_2 \leq f_3$. Again, it is noted that $f_2$ has the same value as $\gamma$. It can be shown that the values $f_2$ and $f_3$ are each greater than or equal to the median of the nine values and, hence, can also be removed from the nine values. Thus, leaving five values including $d_3$, $f_1$ and a group of three values having $\beta$ as its median that is labeled in ascending order as $e_1 \leq e_2 \leq e_3$. These remaining five values are divided into two groups and further sorted. One group includes $d_3$ and $e_1$ that after sorting via sorter 105 are labeled in ascending order as $g_1 \leq g_2$. This sorting requires only one comparison. The second group includes $e_2$, $e_3$ and $f_1$ that after sorting via sorter 106 are labeled in ascending order as $h_1 \leq h_2 \leq h_3$. This sorting only requires two comparisons because $e_2$ and $e_3$ have already been sorted. Of the remaining five values $g_1$, $g_2$, $h_1$, $h_2$ and $h_3$, it can be shown that value $g_1$ is less than or equal to the median of the nine values and can be removed, and that value $h_3$ is greater than or equal to the median of the nine values and can be removed, leaving values $g_2$, $h_1$ and $h_2$. These remaining three values are sorted via sorter 107 and labeled in ascending order as $j_1 \leq j_2 \leq j_3$. This sorting takes only two comparisons because values $h_1$ and $h_2$ have already been sorted. The median value of the group from sorter 107 is the median of the nine values and is value $j_2$. It is noted that in this process four values have been identified that are less than or equal to the median of the nine values, namely, $d_1$, $d_2$, $g_1$ and $j_1$. Similarly, four values have been identified that are greater than or equal to the median of the nine values, namely, $f_2$, $f_3$, $h_3$ and $j_3$.

It should be noted that if so-called pipelining is used in the median filter 110, only one three value sorter is required for sorters 101, 102, 103 and 104 because the prior sorted results are stored for use in the subsequent sorting.

As indicated above, $d_1$ and $d_2$ are each less than or equal to the median of the nine values and, hence, can be removed from the nine values. This can be done because $d_2$ (and hence $d_1$ which is less than $d_2$) is less than or equal to at least 5 of the 9 values (for which the median is desired). Consider the following: $d_2 \leq d_3$ (because they are sorted); $d_2 \leq e_2 \leq e_3$ (because $d_2=\lambda$, $e_2=\beta$ and $\lambda \leq \beta$, and $e_1$, $e_2$ and $e_3$ are sorted); and $d_2 \leq f_2 \leq f_3$ (because $d_2=\lambda$, $f_2 \leq \gamma$, $\lambda \leq \beta \leq \gamma$, and $f_1$, $f_2$ and $f_3$ are sorted). Consequently, $d_2$ is less than or equal to 5 values, namely, $d_3$, $e_2$, $e_3$, $f_2$ and $f_3$.

Recall that the median of the 9 values is the value that is greater than or equal to 4 values, and less than or equal to 4 other values. Since $d_2$ is less than or equal to 5 values, then either $d_2$ is not the median, in which case it can be removed, or $d_2$ is the median. However, if $d_2$ is the median, then $d_2$ must either be equal to $d_3$ or $e_2$, in which case $d_3$ or $e_2$ is also a median, consequently $d_2$ can be removed as well (note that our assertion is that the median is guaranteed to be in the surviving values). How is it known that if $d_2$ is the median, then $d_2$ must be equal to $d_3$ or $e_2$? The proof is as follows: if $d_2$ is equal to $d_3$ then proof done. Otherwise, $d_2$ must be less than $d_3$, i.e., $d_2 < d_3$. In this case, $d_2$ must be equal to $e_2$. Because if otherwise, $d_2$ is not equal to $e_2$, then $d_2 < e_2 \leq e_3 \leq f_2 \leq f_3$. That is, $d_2$ is strictly less than 5 values $d_3$, $e_2$, $e_3$, $f_2$, $f_3$. This shows that $d_2$ could not be the median. This contradiction shows that if $d_2$ is the median, then $d_2$ must be equal to either $d_3$ or $e_2$. Since $d_1 \leq d_2$, the same analysis shows that $d_1$ can be removed.

An analysis essentially identical to that above can be used to show that $f_2$ and $f_3$, and that $g_1$ and $h_3$ can be removed. The main difference is that "less than" is replaced by "greater than" in the above analysis.

Figure 2:
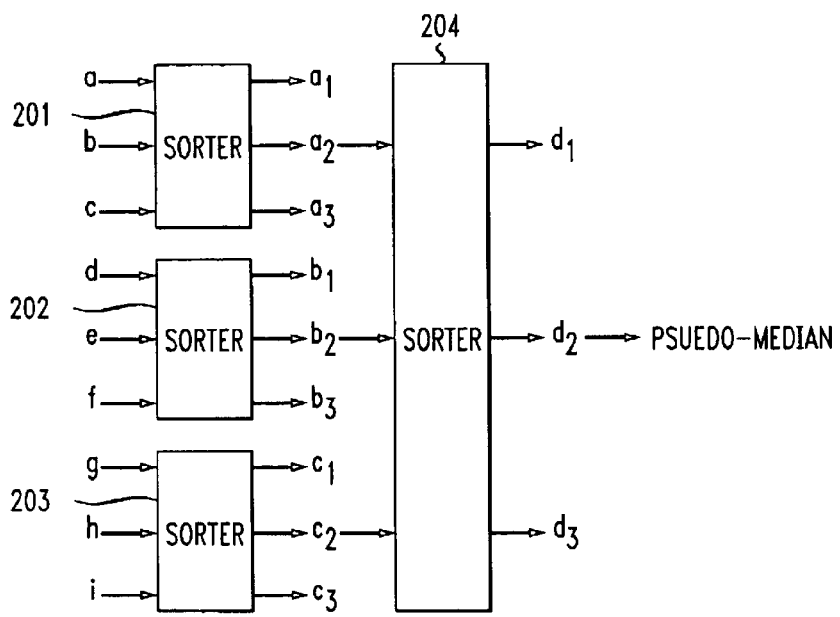
FIG. 2 shows, in simplified form, details of a so-called pseudo nine-value spatial median filter including an embodiment of the invention.

FIG. 2 shows in simplified form a so-called pseudo 9-point spatial median filter. Referring to FIG. 2, it is seen that the 9-points, i.e., values, are arranged into three groups of three values each, namely, a first group including values a, b and c, a second group including values d, e and f, and a third group including values g, h and j. The first group is supplied to sorter 201, the second group to sorter 202 and the third group to sorter 203. Sorters 201, 202 and 203 each perform a complete sort of their respective supplied groups, i.e., arrange the supplied values in either ascending or descending order. In the spatial median filter shown in FIG. 2, it is assumed that the values are arranged in ascending order. That is, $a_3 \leq a_2 \leq a_1$ and so on for the other values. Note that a sort of three values requires three comparisons. Thus, the three sorters 201, 202 and 203 perform nine comparisons. The median of each group is determined to be the middle value in the sorted group. The three medians from sorters 201, 202 and 203, in this example, are $a_2$, $b_2$ and $c_2$, respectively, and are supplied to sorter 204. In turn, sorter 204 sorts the three medians $a_2$, $b_2$ and $c_2$. This requires another three comparisons. After sorting, the three medians $a_2$, $b_2$ and $c_2$, are assumed to be arranged in ascending order and are designated $d_1$, $d_2$, and $d_3$, where $d_1 \leq d_2 \leq d_3$. Take the median of them, namely, $d_2$, as the pseudo-median. Total number of comparisons is 12.

The above-described embodiments are, of course, merely illustrative of the principles of the invention. Indeed, numerous other methods or apparatus may be devised by those skilled in the art without departing from the spirit and scope of the invention.

What is claimed is:

1. A method of determining a median value of a plurality of N values for use in a spatial median filter comprising the steps of:
   arranging said plurality of N values into three groups each having a substantially equal number of values, wherein N is any odd number greater than one;
   sorting the values in each of said three groups to arrange them in a prescribed order;
   determining the group median value of each group of sorted values;
   arranging said group median values in a prescribed order;
   determining in at least one of said three groups a first sub-group of values less than or equal to the median of the group;
   determining in at least one other of said three groups a second sub-group of values that are greater than or equal to the median value of the group;
   eliminating prescribed values in said sub-groups in accordance with prescribed criteria and eliminating prescribed one or more of said group median values of said three groups in accordance with prescribed criteria;
   determining the group median of said group median values;
   determining values remaining after said eliminating of values;
   arranging said remaining values including the group median of said group median values in a second prescribed number of groups;
   sorting said remaining values in each group of said second number of groups to arrange the remaining values in a prescribed order; and
   utilizing said prescribed order of said remaining values to determine the median of the plurality of N values.

2. The method as defined in claim 1 wherein said median value is a middle value of each group of the sorted values.

3. The method as defined in claim 1 wherein said N number of values is at least nine (9).

4. The method as defined in claim 1 wherein said step of utilizing includes a step of selecting a prescribed one of said median values of said groups in said prescribed order as said median of said plurality of N values.

5. The method as defined in claim 1 wherein said step of utilizing further includes steps of eliminating prescribed ones of said ordered remaining values in accordance with prescribed criteria to obtain a set of values, sorting said set of values to arrange the values in said set in a prescribed order and selecting the median value of said ordered set of values as the median of said plurality of N values.

6. The method as defined in claim 5 wherein said group median value is a middle value of each group of the sorted values.

7. The method as defined in claim 5 wherein said number of values is at least nine (9).

8. Apparatus for determining a median value of a plurality of N values for use in a spatial median filter comprising:
   a first plurality of sorters, each for arranging a supplied group of values of said plurality of N values in a prescribed order, for selecting a group median value of said ordered values for the group, said plurality of N values being arranged into three groups each having a substantially equal number of values and individual ones of said three groups of values being supplied on a one-to-one basis to said first plurality of sorters, wherein N is any odd number greater than one;
   an at least one second sorter arranges said median values in a prescribed order,
   determines the group median of said group median values,
   determines in a prescribed at least one of said three groups a first sub-group of values less than or equal to the median value of the group,
   determines in a prescribed at least one other of said three groups a second sub-group of values that are greater than or equal to the median value of the group,
   said determined values in said at least one and said at least one other sub-groups being eliminated in accordance with prescribed criteria and prescribed one or more of said group median values of said three groups being eliminated in accordance with prescribed criteria,
   determining the median of said group median values; and
   a second plurality of sorters, supplied with values remaining after said eliminating of said determined values and any remaining group median values in a second prescribed number of groups including said group median of said group median values,
   said second plurality of sorters for sorting said remaining values, each of said second groups being supplied to said second plurality of sorters on a group-by-group basis for arranging the remaining values in each of said second groups in a prescribed order and utilizing said remaining values in said prescribed order for determining the median of the plurality of N values.

9. The apparatus as defined in claim 8 wherein said median value is a middle value of each group of the sorted values.

10. The apparatus as defined in claim 8 wherein said number of values is at least nine (9).

11. The apparatus as defined in claim 8 further including at least one third sorter supplied with said remaining values less prescribed ones of said ordered remaining values which have been eliminated in accordance with prescribe criteria to obtain a set of values, for sorting said set of values to arrange the values in said set in a prescribed order and selecting the median value of said ordered set of values as the median of said plurality of N values.

12. The apparatus as defined in claim 11 wherein said median value is a middle value of each group of the sorted values.

13. The apparatus as defined in claim 11 wherein said N number of values is at least nine (9).

* * * * *